US 6,717,896 B1

(12) United States Patent
Imanishi

(10) Patent No.: US 6,717,896 B1
(45) Date of Patent: Apr. 6, 2004

(54) CONTROLLING A GAP LENGTH IN A NEAR-FIELD AREA IN AN EXPOSURE APPARATUS

(75) Inventor: Shingo Imanishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 203 days.

(21) Appl. No.: 09/606,709

(22) Filed: Jun. 29, 2000

(30) Foreign Application Priority Data

Jul. 7, 1999 (JP) ........................................ P11-193545

(51) Int. Cl.[7] .............................................. G11B 7/095
(52) U.S. Cl. ............................... 369/53.27; 369/44.37; 369/13.33; 369/300; 360/234.6
(58) Field of Search ........................ 369/53.26, 44.37, 369/44.38, 53.27, 13.33, 300; 360/234.3, 234.6

(56) References Cited

U.S. PATENT DOCUMENTS

| 4,376,303 A | * | 3/1983 | Lurie | 369/45 |
| 4,706,232 A | * | 11/1987 | Funada et al. | 369/13.02 |
| 4,717,222 A | * | 1/1988 | Iwasaki et al. | 359/212 |
| 5,004,307 A | * | 4/1991 | Kino et al. | 350/1.2 |
| 5,121,256 A | * | 6/1992 | Corle et al. | 359/664 |
| 5,295,125 A | * | 3/1994 | Oonishi et al. | 369/44.29 |
| 6,127,681 A | * | 10/2000 | Sato et al. | 250/306 |
| 6,181,478 B1 | * | 1/2001 | Mandella | 359/642 |
| 6,292,442 B1 | * | 9/2001 | Kasono | 369/44.23 |
| 6,359,852 B1 | * | 3/2002 | Ueyanagi | 369/118 |
| 6,445,447 B1 | * | 9/2002 | Wang et al. | 356/237.2 |

* cited by examiner

Primary Examiner—Gautam R. Patel
(74) Attorney, Agent, or Firm—Oblon, Spivak, McClelland, Maier & Neustadt, P.C.

(57) ABSTRACT

To control the gap length in the near-field area with a high accuracy, the exposure apparatus includes an exposure light source (11) to emit an exposure laser light, a gap length controlling light source (16) to emit a gap length controlling laser light different in wavelength from the exposure laser light, a condenser lens (17a), collimator lens (17b) and a dichroic mirror (12) to project the gap length controlling laser light to a condenser lens (14) and solid immersion lens (SIL) (15), and a photodetector (22) to detect the intensity of a return part of the gap length controlling laser light from an outgoing surface (15b) of the SIL (15). Thus in the exposure apparatus, the gap between the SIL (15) and object (100) is controlled based on the detected return light intensity from the photodetector (22).

18 Claims, 6 Drawing Sheets

CONTROLLING A GAP LENGTH IN A NEAR-FIELD AREA IN AN EXPOSURE APPARATUS

BACKGROUND OF THE INVENTION

1. Field of the Invention

The present invention relates to an exposure apparatus and method, an optical disc drive for, and recording and/or reproducing method of, recording and/or reproducing information signal to and/or from a signal recording medium.

2. Description of the Related Art

Write or read of information signal to or from an optical disc is done by condensing a laser light to a predetermined spot diameter and projecting it to a signal recording layer of an optical recording medium.

For the irradiation of the laser light converged to the predetermined spot diameter to the signal recording surface layer, it is necessary to adjust the distance between an objective lens and optical disc for the signal recording layer of the optical disc to be positioned within a focal depth of the objective lens.

The above is also true with exposure of a photoresist coated applied on a disc-like substrate to a laser light to produce a stamper for use to manufacture of an optical disc. That is, it is necessary to converge the laser light to a predetermined spot diameter and project it to the photoresist on the glass substrate. The exposure on the disc-like substrate of the photoresist to the laser light is effected as will further be described below with reference to FIG. 1.

First, a disc-like substrate 101 having a smooth, mirror-finished surface is prepared as shown in FIG. 1. The substrate 101 is made of glass, for example.

As shown in FIG. 1B, the substrate 101 is applied to the smooth, mirror-finished surface thereof with a photoresist layer 102 to a predetermined thickness.

Then, a laser light is projected through an objective lens 112 to the photoresist layer 102 on the substrate 101 being rotated as shown in FIG. 1C. At this time, the objective lens 112 is moved in the direction of the optical axis thereof so that a laser light spot having a predetermined diameter will be defined on the photoresist layer 102. Namely, the laser light is focused on the photoresist layer 102.

Owing to this exposure to the laser light, there will be formed a fine latent image 102a, namely, latent image of a pit or groove, along a spiral line. Thus, the photoresist layer 102 will have a pattern of latent pit or groove images formed therein.

By developing the photoresist layer 102 thus exposed to the laser light, parts of the photoresist layer 102 on the substrate 101 are removed according to the exposed pattern as shown in FIG. 2, to provide an original substrate having tiny pits or grooves formed and which is used for further preparing a stamper for manufacture of an optical disc. The tiny concavities and convexities 102b in the photoresist layer 102 as shown in FIG. 2A will result in lands and grooves in the optical disc, while the tiny concavities and convexities 102c in the photoresist layer 102 as shown in FIG. 2B will result in pits in the optical disc.

The original substrate thus formed using the exposure apparatus is used to prepare a stamper for use to manufacture an optical disc.

As in the above, for the exposure apparatus used to prepare the original substrate for the optical disc stamper and optical disc drive to write or read information signal to or from the optical disc thus manufactured, a technique is required to irradiate a light sport having a predetermined diameter to an object such as an original substrate for manufacture of an optical disc and the optical disc itself. Conventionally, the astigmatic method, skew beam method, knife edge method, etc. are adopted to control the distance between the objective lens and object (will be referred to as "gap length" hereinafter). However, all these methods use a reflected laser light from the signal recording layer of the optical disc.

To meet the recent need for a higher density recording in the optical disc, it has been proposed to dispose between a condenser lens and optical disc a solid immersion lens (SIL) being a part cut from a spherical lens and having a high refractive index in order to further reduce the diameter of laser light spot which is defined on the photoresist on the original substrate or the optical disc. The condenser lens and SIL form together a so-called two-group lens. Owing to the SIL, a larger numerical aperture than that of the condenser lens (larger than 1 for example) can be realized. For example, the SIL is disposed on the optical disc so that the distance (namely, gap length) between the main side thereof (opposing the optical disc) and optical disc is on the order of 100 mn and thus within a so-called near-field area.

If the gap length between the SIL and an object (photoresist on the original substrate or optical disc) is outside the near-field area when the numerical aperture is larger than 1, a component of the intensity of the laser light outgoing from the SIL towards the optical disc, which causes the numeral aperture to be larger than 1, is considerably low. Therefore, it is necessary to control the gap length for the gap length to be constant inside the near-field area.

Even when the gap length between the SIL and object varies in a very narrow range such as the near-field area, the reflected laser light from the optical disc will vary very little. So, it is difficult to detect the gap length between the SIL and object with a high accuracy based on a variation of the reflected laser light from the optical disc. Therefore, with the conventional control of the gap length based on the reflected laser light from the optical disc, it is difficult to control the gap length between the SIL and object with a high accuracy.

OBJECT AND SUMMARY OF THE INVENTION

Accordingly, the present invention has an object to overcome the above-mentioned drawbacks of the prior art by providing an exposure apparatus and method, and recording and/or reproducing apparatus and method, in which the gap length in the near-field area can be controlled with a high accuracy.

The above object can be attained by providing an exposure apparatus having a convergent lens disposed opposite to an object and in a near-field of the object to converge an exposure laser light on the object, the apparatus including according to the present invention:

an exposure light source to emit the exposure laser light;
a gap length controlling light source to emit a gap length controlling laser light different in wavelength from the exposure laser light;
means for projecting the gap length controlling laser light to the convergent lens;
means for detecting the intensity of a return part of the gap length controlling laser light from a surface of the convergent lens opposite to the object; and
means for controlling the gap length between the convergent lens and object based on the light intensity detected by the light intensity detecting means.

In the above exposure apparatus, the gap length controlling laser light different in wavelength from the exposure laser light is projected onto the convergent lens by the light projecting means, and the intensity of the return part of the gap length controlling laser light from the surface of the convergent lens opposite to the object is detected by the light intensity detecting means. Based on the return light intensity detected by the light intensity detecting means, the gap length between the convergent lens and object is controlled by the gap length controlling means.

Thus, in the exposure apparatus, the gap length between the convergent lens which condenses the exposure laser light on the object and the object is controlled based on the detected intensity of the return part of the gap length controlling laser light from the surface of the convergent lens opposite to the object.

Also the above object can be attained by providing an exposure method in which in which an exposure laser light is converged on an object by a convergent lens disposed opposite to the object and in a near-field area of the object, the method including, according to the present invention, steps of:

projecting a gap length controlling laser light having a different wavelength from that of the exposure laser light to the convergent lens upon which the exposure laser light is incident;

detecting the intensity of a return part of the gap length controlling laser light from a surface of the convergent lens opposite to the object; and controlling the gap length between the convergent lens and object based on the detected intensity of the return light.

Thus, in the exposure method, the gap length between the convergent lens which condenses the exposure laser light on the object and the object is controlled based on the detected intensity of the return part of the gap length controlling laser light from the surface of the convergent lens opposite to the object.

Also the above object can be attained by providing an optical disc drive having a convergent lens disposed opposite to a signal recording medium object and in a near-field of the signal recording medium to converge a writing and/or reading laser light on the signal recording medium, the apparatus including according to the present invention:

a light source to emit the writing and/or reading laser light;

a gap length controlling light source to emit a gap length controlling laser light different in wavelength from the writing and/or reading laser light;

means for projecting the writing and/or reading laser light to the convergent lens;

means for detecting the intensity of a return part of the writing and/or reading laser light from a surface of the convergent lens opposite to the signal recording medium; and means for controlling the gap length between the convergent lens and signal recording medium based on the light intensity detected by the light intensity detecting means.

In the above optical disc drive, the gap length controlling laser light different in wavelength from the writing and/or reading laser light is projected onto the convergent lens by the light projecting means, and the intensity of the return part of the gap length controlling laser light from the surface of the convergent lens opposite to the signal recording medium is detected by the light intensity detecting means. Based on the return light intensity detected by the light intensity detecting means, the gap length between the convergent lens and signal recording medium is controlled by the gap length controlling means.

Thus, in the optical disc drive, the gap length between the convergent lens which condenses the exposure laser light on the object and the object is controlled based on the detected intensity of the return part of the gap length controlling laser light from the surface of the convergent lens opposite to the object.

Also the above object can be attained by providing a recording and/or reproducing method in which in which a writing and/or reading laser light is converged on a signal recording medium by a convergent lens disposed opposite to the signal recording medium and in a near-field area of the signal recording medium, the method including, according to the present invention, steps of:

projecting a gap length controlling laser light different in wavelength from the writing and/or reading laser light to the convergent lens upon which the writing and/or reading laser light is incident;

detecting the intensity of a return part of the gap length controlling laser light from a surface of the convergent lens opposite to the signal recording medium; and controlling the gap length between the convergent lens and signal recording medium based on the detected intensity of the return light.

Thus, in the recording and/or reproducing method, the gap length between the convergent lens which condenses the exposure laser light on the object and the object is controlled based on the detected intensity of the return part of the gap length controlling laser light from the surface of the convergent lens opposite to the object.

These objects and other objects, features and advantages of the present intention will become more apparent from the following detailed description of the preferred embodiments of the present invention when taken in conjunction with the accompanying drawings.

DETAILED DESCRIPTION OF THE PREFERRED EMBODIMENTS

Figure 1A:
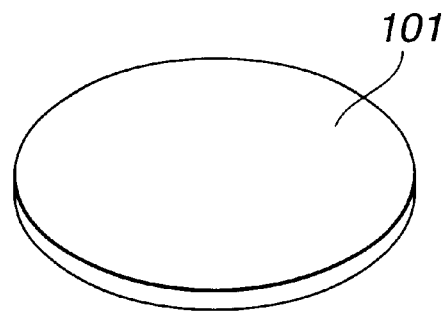
FIGS 1A, 1B and 1C are perspective views showing a process of preparing an optical disc stamper by an exposure apparatus.
Figure 1B:
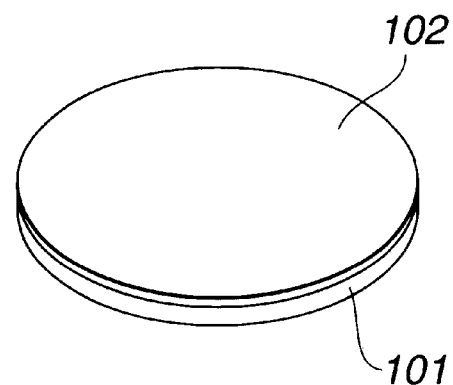
Figure 1C:
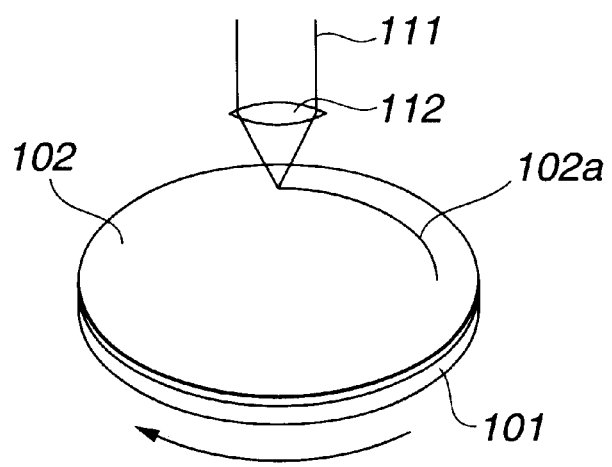
Figure 2A:
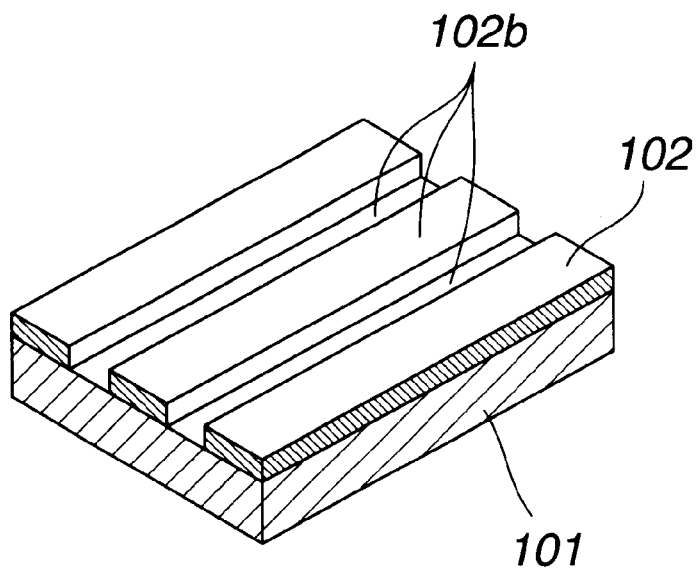
FIGS 2A and 2B are perspective views showing a part of the optical disc stamper in having tiny pits formed therein by exposure by the exposure apparatus.
Figure 2B:
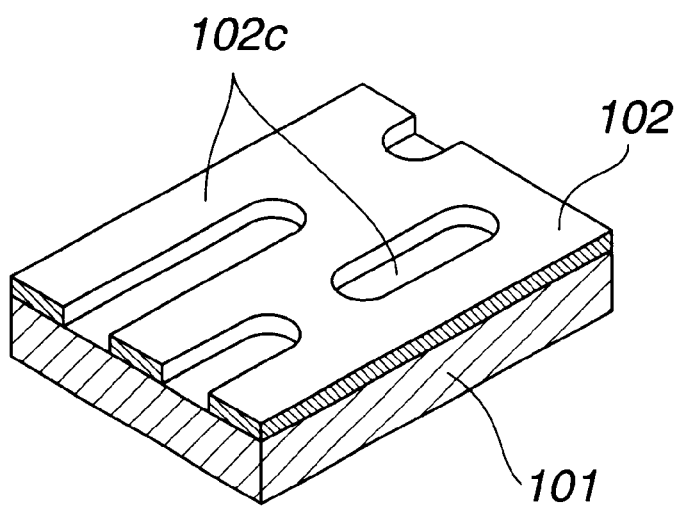
Figure 3:
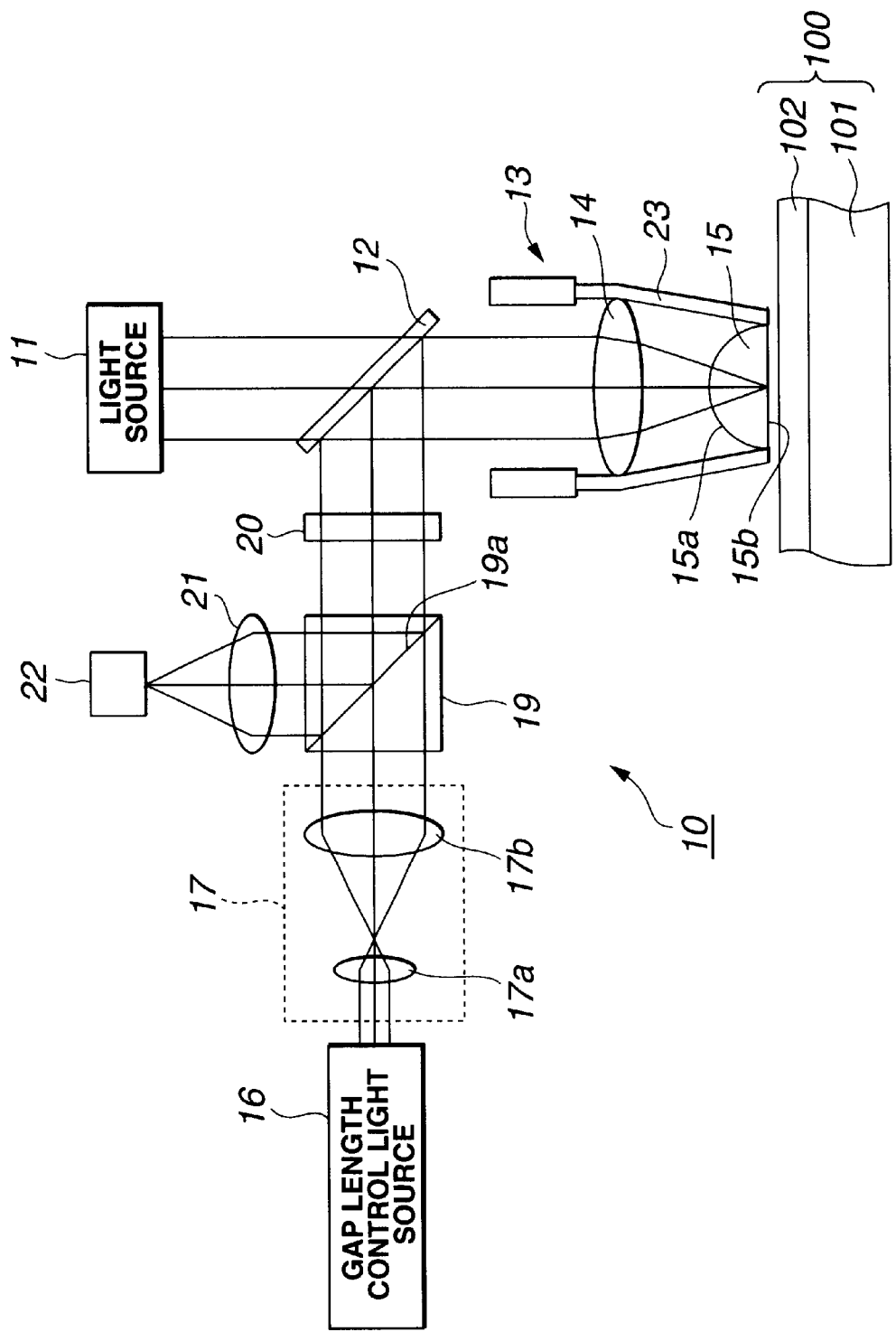
FIG. 3 is a block diagram of an embodiment of the exposure apparatus according to the present invention.

Referring now to FIG. 3, there is illustrated in the form of a block diagram the embodiment of the exposure apparatus according to the present invention. The exposure apparatus has an optical head generally indicated with a reference 10. As shown, the optical head 10 includes an exposure light source 11, dichroic mirror 12, moving member 13, condenser lens 14, solid immersion lens (SIL) 15, gap length controlling light source 16, beam expander 17 consisting of a condenser lens 17a and collimator lens 17b, polarizing beam splitter 19, ¼ wave plate 20, condenser lens 21, and a photodetector 22.

In the exposure apparatus, the condenser lens 14 and SIL 15 form together a so-called two-group objective lens. In the exposure apparatus, the exposure light source 11 is provided to emit an exposure laser light. The gap length controlling light source 16 is provided to emit a gap length controlling laser light different in wavelength from the exposure laser light. The condenser lens 17a, collimator lens 17b and dichroic mirror 12 are provided to project the gap length controlling laser light onto the converging lens consisting of the condenser lens 14 and SIL 15. The photodetector 22 is provided to detect the intensity of a return part of the gap length controlling laser light from a surface of the SIL 15 opposite to an object 100. The condenser lens 14 and SIL 15 work together to converge the laser light. The exposure apparatus further includes a controlling means (not shown) for controlling the gap (or gap length) between the SIL 15 and object 100 based on the intensity of return light, detected by the photodetector 22.

The SIL 15 provided in the exposure apparatus as a lens facing the object 100 which is a photoresist-coated substrate for an optical disc stamper, permits to project a light spot in a so-called near-field area.

As shown, the object 100 is a substrate 101 having a photoresist 102 layer applied thereon. The substrate 101 is made of glass for example.

The exposure light source 11 emits an exposure laser light to which the photoresist layer 102 is sensitive. More specifically, the exposure laser light has a wavelength of 413 nm, which is shorter than that of the gap length controlling laser light which will further be described.

The exposure laser light emitted from the exposure light source 11 is passed through the dichroic mirror 12 and incident upon the condenser lens 14. The dichroic mirror 12 is provided to reflect the gap length controlling laser light as will further be described later. The exposure laser light incident upon the condenser lens 14 is converged by the lens 14 itself and incident upon the SIL 15.

As mentioned above, the SIL 15 forms along with the condenser lens 14 the converging lens which condenses the exposure laser light onto the object 100. The condenser lens 14 is generally called "objective lens" in the technology in which it is used along with such a solid immersion lens to implement a high density recording optical disc.

The SIL 15 is generally hemispheric. It consists of an incident surface 15a upon which the laser light having passed through the condenser lens 14 is incident, and a generally flat surface 15b opposing the object 100 (will be referred to as "outgoing surface" hereinafter).

The laser light passed through the condenser lens 14 is refracted at the incident surface 15a of the SIL 15 having the above-mentioned structure, and further at the outgoing surface 15b. Thus a light spot is defined on the object 100.

Note that the relation between the numerical aperture (NA) realized by the condenser lens 14 and SIL 15 and the refractive index of the SIL 15 is expressed as follows:

$$NA = n \times \sin \theta_{max}$$

where n is a refractive index of the SIL 15 and θ max is the maximum incident angle. The refractive index n and maximum incident angle θ max are set based on a relation that the product ($n \times \sin\theta_0$) of a constant incident angle $\theta_0$ smaller than the maximum incident angle θ max and the refractive index n is 1.

The SIL 15 and condenser lens 14 are supported together by a support member 23 having a moving member 13 fixed at the end thereof.

The moving member 13 moves the support member 23 and thus moves the condenser lens 14 and SIL 15 fixed to the support member 23 and forming together the two-group lens towards and away from the object 100. For example, the moving member 13 is a piezo stack which can be extended and shrunk when supplied with a voltage. In the optical head 10, the gap length between the outgoing surface 15b of the SIL 15 and the object 100 is adjusted to a predetermined distance by controlling the extension and shrinkage of the moving member 13. When the gap length is adjusted to an optimum distance by controlling the extension and shrinkage of the moving member 13, the exposure laser light going out of the SIL 15 will define a desired light spot on the object 100.

This gap length is controlled based on the gap length control laser light emitted from the gap length controlling light source 16.

The gap length controlling light source 16 emits a laser light different in wavelength from the exposure light source 11. The wavelength of the gap length controlling laser light is longer than that of the exposure laser light and not in a range to which the object 100 is sensitive. More specifically, the gap length controlling light source 16 is a helium (He)-neon (Ne) gas laser light source which emits a gap length controlling laser light whose wavelength is 633 nm. The gap length controlling laser light emitted from the gap length controlling light source 16 will have the laser light diameter changed by the beam 17 to a larger one than that of the laser light emitted from the gap length controlling light source 16. The gap length controlling laser light having the increased diameter is passed through the polarizing beam splitter 19 and ¼ wave plate 20 and incident upon the dichroic mirror 12.

The polarizing beam splitter 19 and ¼ wave plate 20 are provided for the photodetector 22 to detect a return part of the gap length controlling laser light as will further be described later.

The dichroic mirror 12 is provided to reflect a light of a predetermined wavelength, and set to reflect the gap length controlling laser light emitted from the gap length controlling light source 16. Also the dichroic mirror 12 is disposed in the light path of the exposure laser light emitted from the exposure light source 11, and the exposure laser light is passed through the dichroic mirror 12 and incident upon the condenser lens 14 as in the above. The gap length controlling laser light is reflected by the dichroic mirror 12 towards the condenser lens 14.

The gap length controlling laser light incident upon the condenser lens 14 is projected to the object 100 through the condenser lens 14 and SIL 15. Namely, the gap length controller laser light is projected to the object 100 along a similar optical path to that of the exposure laser light. That is, the gap length controlling laser light reflected by the dichroic mirror 12 and the exposure laser light will be combined on the same optical path and incident upon the condenser lens 14 and SIL 15.

Of the gap length controller laser light incident upon the SIL 15, a part reflected at the outgoing surface 15b of the SIL 15 (will be referred to as "gap length controlling return light" hereinafter) is incident upon the dichroic mirror 12 through the SIL 15 and condenser lens 14. The gap length controlling return light has such a wavelength that the return light will not be passed through the dicliroic mirror 12, and so it will be reflected by the dichroic mirror 12 towards the ¼ wave plate 20 where a circularly polarized light is converted to a linearly polarized one.

Also, of the exposure laser light incident upon the SIL 15, a part reflected at the outgoing surface 15b of the SIL 15 (will be referred to as "exposure return light" hereinafter) is incident upon the dichroic mirror 12 through the SIL 15 and condenser lens 14. However, since the waveband of the dichroic mirror 12 in which the laser light is allowed to pass is set based on the wavelength of the exposure laser light, the exposure return light will be passed towards the exposure light source 11 without being reflected by the dichroic mirror 12.

The gap length controlling return light converted to a linearly polarized light by the ¼ wave plate 20 is reflected at a reflecting surface 19a of the polarizing beam splitter 19 towards the photodetector 22.

The gap length controlling return light reflected towards the photodetector 22 is converged by the condenser lens 21 and detected by the photodetector 22 which will provide an electric signal corresponding to the intensity of the light detected by the photodetector 22. In the exposure apparatus, the electric signal output from the photodetector 22, corresponding to the detected light intensity, is monitored for servo control of the gap length.

Each component of the optical head 10 constructed as in the above functions for servo control of the gap length as will be described below:

A voltage is applied to the moving member 13 being a piezo stack, for example, to move the SIL 15 upward to near the object 100 having the photoresist layer 102 applied thereon, thereby moving the SIL 15 to a near-field area in which there is little gap between the outgoing surface 15b of the SIL 15 and the surface of the photoresist 102.

It is only when the SIL 15 is moved to the near-field area and into an optical contact with the object 100 that a numerical aperture larger than 1 is realized by the condenser lens 14 and SIL 15. Only in this case, the laser light (of a high frequency) incident upon the SIL 15 from the condenser lens 14 at a larger incident angle than the incident angle $\theta_0$ goes out of the outgoing surface 15b and projected to the object 100.

For example, when the SIL 15 is moved away from the object 100 in the near-field area, the laser light of high frequency not going out of the outgoing surface 15b of the SIL 15 but reflected at the outgoing surface 15b radically increases. When the SIL 15 is further moved away from the object 100 and leaves the near-field, the laser light of high frequency is nearly full (100%) reflected at the outgoing surface 15b.

Figure 4:
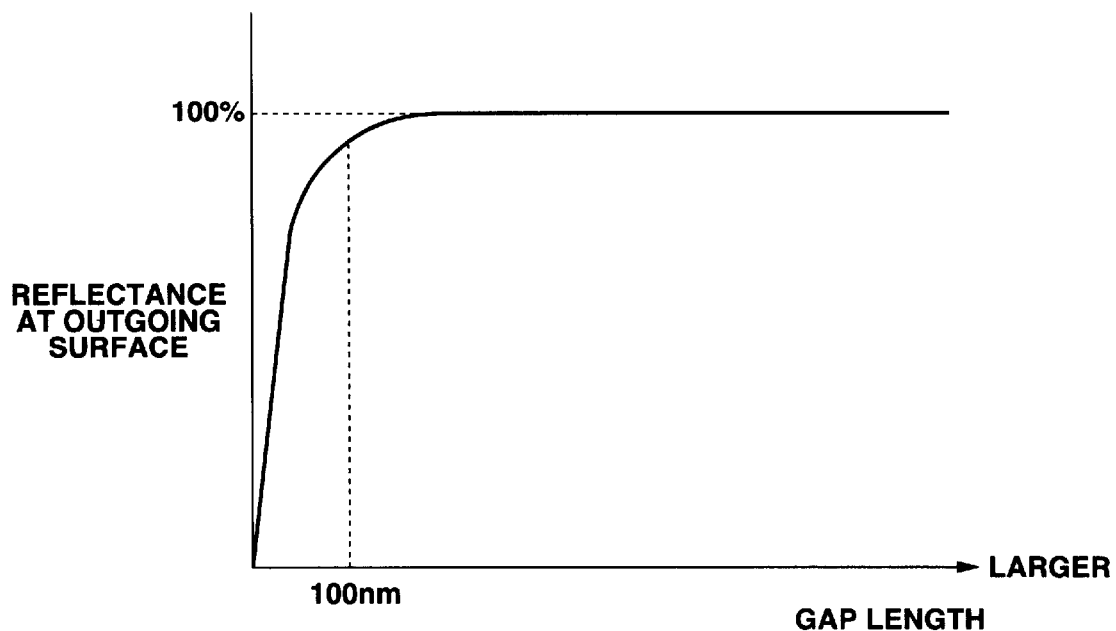
FIG. 4 shows a characteristic curve of the reflectance at the outgoing surface of SIL near of the near-field area.

Thus, as the SIL 15 is moved towards the near-field area, more laser light of high frequency is passed through the outgoing surface 15b, so that the part of the laser light will decrease. For example, when the gap between the SIL 15 and object 100 is short as shown in FIG. 4, the reflectance at the outgoing surface 15b of the SIL 15 becomes low. Therefore, when the SIL 15 reaches the near-field area, the photodetector 22 will detect a reduced amount of light.

The above phenomenon is utilized in the exposure apparatus to control the gap length. The intensity of the gap length controlling return light is detected by the photodetector 22, and the gap length is controlled based on the detected intensity of the return light.

Therefore, in the exposure apparatus, the moving member 13 is driven to move the SIL 15 to near the near-field area until the photodetector 22 detects a predetermined reduced intensity of the gap length controlling return light, thereby controlling the gap length so that the photoresist layer 102 on the object 100 can be exposed to a desired light spot. For example, in the exposure apparatus, the gap length is controlled so that the photodetector 22 detects 60% of the intensity of the gap length controlling return light which would be when the gap length controlling laser light is totally reflected.

The use of the exposure beam to control the gap length will be considered herebelow. The exposure power depending upon a linear velocity varies, and output of the exposure beam varies due to modulation. For example, when the output is turned on and off repeatedly, the gap length controlling signal and modulation signal will be superposed, resulting in a servo control system which is not stable.

By providing a lowpass filter in the servo loop, the influence of the modulation on the exposure beam output can be reduced but the servo control will be done with a lower accuracy. Therefore, this approach is practically impossible.

The embodiment of the exposure apparatus according to the present invention includes the gap length controlling light source 16 separately from the exposure light source 11. By using the return light of the gap length controlling laser light emitted from the gap length controlling light source 16, the gap length can be controlled without the influence of the variation of the exposure power due to a linear velocity change and the variation of the laser output due to a modulation. Therefore, since the gap length can be controlled using the gap length controlling laser light whose output is maintained constant, not any exposure laser light output or the like, the servo control can be done stably.

By selecting, for the gap length controlling laser light, a laser light whose wavelength is not included in a range to which the photoresist layer 102 is sensitive, the photoresist layer 102 is not susceptible to the gap length controlling laser light.

Further, as long as the gap length controlling laser light has a wavelength to which the photoresist layer 102 is not sensitive, it is possible to select a gap length controlling laser light output with an increased freedom. Thus, the gap length controlling laser light output is increased so that a large signal-to-noise (S/N) ratio of the return light detection can be selected, for example. Thereby, the servo control can be effected more stably.

In the foregoing, the present invention has been described concerning the embodiment of the exposure apparatus. As having previously been mentioned, however, the present invention is applicable to an optical disc drive to and/or from which information signal can be written and/or read.

Figure 5:
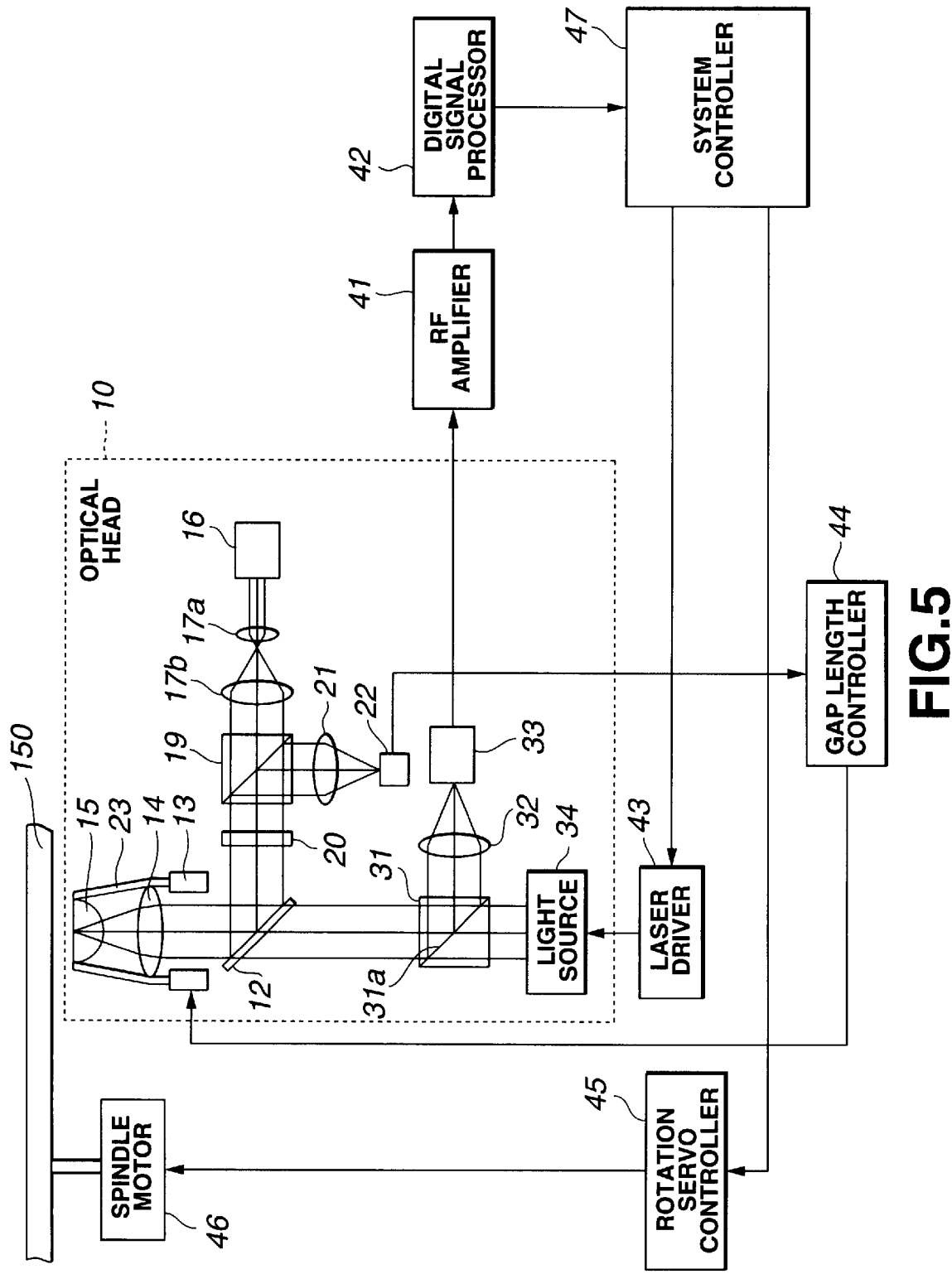
FIG. 5 is a block diagram of an embodiment of the optical disc drive according to the present invention.

Referring now to FIG. 5, there is illustrated in the form of a block diagram the embodiment of the optical disc drive according to the present invention. As shown, the optical disc drive includes an optical head 10 which is constructed generally similarly to the exposure apparatus having been described in the foregoing. The same parts as in the exposure apparatus will be indicated with the same reference numerals as in FIG. 3 and will not be described below any longer.

As shown in FIG. 5, the optical head 10 includes a polarizing beam splitter 31, condenser lens 32 and a photodetector 33 to reproduce a return part of a laser light projected to an optical disc 150 and modulated by information signal on the optical disc 150 (the return part will be referred to as "information-modulated return light" hereinafter). Also the optical head 10 includes a light source 34 to emit a writing and/or reading laser light.

Further the optical disc drive includes an RF amplifier 41, digital signal processor 42, laser driver 43, gap length controller 44, rotation servo controller 45, spindle motor 46 and a system controller 47. These components are provided to process the information read from the optical disc 150 by the optical head 10.

The writing and/or reading light source 34 is controlled, concerning its output, by the laser driver 43 whether write or read is made. The laser light emitted from the writing and/or reading light source 34 is passed through the polarizing beam splitter 31 and then through the dichroic mirror 12, condenser lens 14 and SIL 15 as in the exposure apparatus and condensed on the signal recording layer of the optical disc 150.

The information-modulated return light from the signal recording layer is incident upon the polarizing beam splitter 31 through the SIL 15, condenser lens 14 and dichroic mirror 12. The information-modulated return light is reflected at a reflecting surface 31a of the polarizing beam splitter 31 towards the photodetector 33.

There is provided between the polarizing beam splitter 31 and photodetector 33 a condenser lens 32 which will condense the information-modulated return light on the photodetector 33.

The photodetector 33 provides an electric signal corresponding to the intensity of the return light. The electric signal output from the photodetector 33 is supplied to the RF amplifier 41 where it will be amplified. The read signal thus amplified in the RF amplifier 41 is supplied to the digital signal processor 42.

The digital signal processor 42 converts the supplied read signal to a digital signal.

The system controller 47 controls each of the components of the optical disc drive. For example, the system controller 47 controls the optical disc rotation servo system and output of the writing and/or reading light source 34 based on the digital signal output from the digital signal processor 42.

The laser driver 43 is supplied with a control signal from the system controller 47 and controls the output of the writing and/or reading light source 34. More specifically, the laser driver 43 controls, according to the control signal from the system controller 47, the laser light output of the writing and/reading light source 34 to a predetermined output for data read or write.

The rotation servo controller 45 controls the operation of the spindle motor 46 which drives to rotate the optical disc 150. The rotation servo controller 45 is supplied with a control signal from the system controller 47 and controls the operation of the spindle motor 46 to rotate the optical disc 150 at a predetermined speed.

The photodetector 22 provides an output signal corresponding to the intensity of the gap length controlling return light. Supplied with the output signal from the photodetector 22, the gap length controller 44 controls the gap length. In the optical disc drive, the gap length is controlled as in the exposure apparatus to drive the moving member 13 so that the intensity of the gap length controlling return light is detected by the photodetector 22 to be constant.

In the optical disc drive constructed as in the above, a laser light having an optimum power is emitted from the writing and/or reading light source 34 to write and/or read information signal to and/or from the optical disc 150, while the gap length controlling laser light is emitted from the gap length controlling light source 16 and a gap length controlling return light from the optical disc 150 is detected by the photodetector 22 to control the gap length.

In the optical disc drive, the gap length controlling light source 16 is provided separately from the writing and/or reading light source 34 as mentioned above. The gap length can be controlled based on the gap length controlling return light, a return part of the gap length controlling laser light emitted from the gap length controlling light source 16, without being influenced by a variation of the exposure power due to a change of linear velocity and variation of the laser output due to the modulation by information signal. Namely, the gap length is controlled using the gap length controlling laser light maintained constant, not the exposure laser light for write and/or read information signal. Thus, the servo control can be done stably.

Also, since a gap length controlling laser light is selected whose wavelength is not in a range to which the signal recording layer of the optical disc 150 is sensitive, information signal recorded on the signal recording layer of the optical disc 150 will not adversely be influenced.

Further, as in the exposure apparatus having previously been described, as long as the wavelength of the gap length controlling laser light is not included in a range to which the signal recording layer of the optical disc 150 is sensitive, it is possible to select a gap length controlling laser light output with an increased freedom. Thus, the gap length controlling laser light output is increased so that a large signal-to-noise (S/N) ratio of the return light detection can be selected, for example. Thereby, the servo control can be effected more stably.

Note that a part of the gap length controlling laser light not reflected at the outgoing surface 15b of the SIL 15 and going out of the outgoing surface 15b may possibly be reflected at the signal recording layer of the optical disc 150 and detected as a return light by the photodetector 22. In this case, the return light will adversely be influenced by information signal recorded in the optical disc 150. For example, the return light will contain a component modulated by the information signal recorded in the optical disc 150.

However, since the frequency detected as information signal in the optical disc 150 is sufficiently high in comparison with the focus servo controlling frequency and the influence of the information signal recorded in the optical disc 150 can be ignored, the gap length can be controlled without being influenced by any component, if any contained in the return light, modulated by the information signal.

Moreover, for example, when a magneto-optical disc in which information signal is magnetically recorded is used in the optical disc drive, the gap length controlling return light may possibly contain a component modulated by the information signal under the so-called Kerr effect. However, the component can be removed by filtering.

Figure 6:
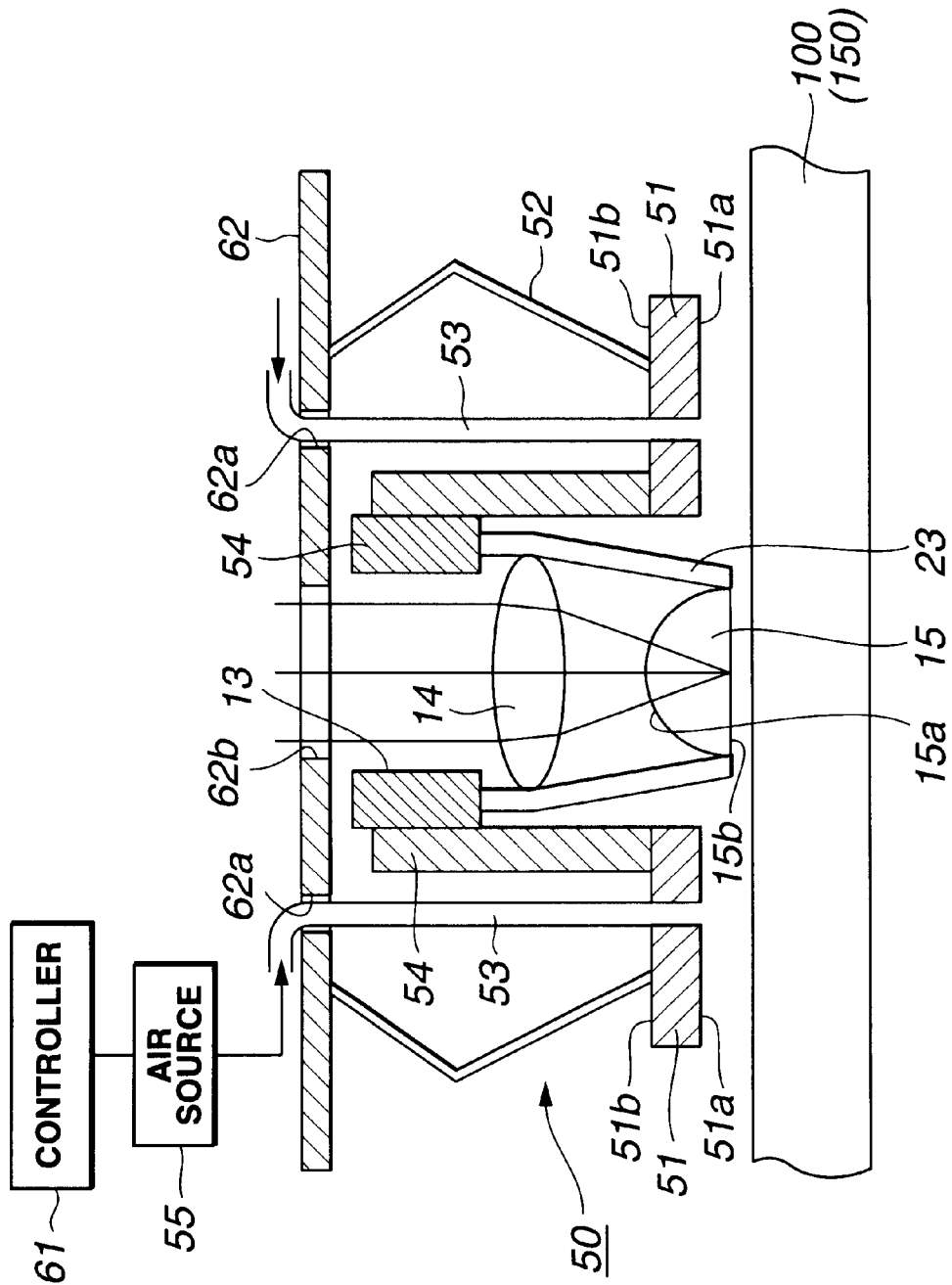
FIG. 6 is a front view of a second moving member.

Referring now to FIG. 6, there is illustrated in the form of a front view a second moving member 50 which may be provided in the exposure apparatus or optical disc drive to move the condenser lens 14 and SIL 15 towards and away from the object 100 or optical disc 150.

As shown, the second moving member 50 is designed to provide an air layer between the object 100 and the support member 23 to which the condenser lens 14 and SIL 15 are fixed, thus floating the support member 23.

As shown in FIG. 6, the second moving member 50 includes an air slider 51, elastic member 52, air supply nozzle 53, second support member 54 and an air source 55.

The second support member 54 supports the support member 23 having fixed thereto the condenser lens 14 and SIL 15, opposite to the object 100. For example, the second support member 54 is formed generally cylindrical. It houses the support member 23 and has installed at one end thereof the first moving member 13 fixed to the support member 23. The air slider 51 is installed at the other end of the second support member 54.

The air slider 51 is formed flat and has a main surface 51a thereof fixed to the second support member 54, opposite to the object 100. As shown, the air slider 51 has penetrated therein from a rear surface 51b thereof to the man surface 51a the air supply nozzle 53 which provides an air jet.

The second moving member 50 is supported by an arm 62. More particularly, the elastic member 52 such as a leaf spring fixed at one end thereof to the arm 62 is fixed at the other end to the rear surface 51b of the air slider 51. Thus the second moving member 50 is supported elastically by the arm 62.

The air supply nozzle 53 is connected at the other end thereof to the air source 55 and supplied with air from the latter. The air supply nozzle 53 is penetrated through the arm 62 and fixed at one end thereof to the air slider 51. The arm 62 has formed therein a nozzle insertion hole 62a through which the air supply nozzle 53 is passed. The nozzle insertion hole 62a has a larger diameter than the outside diameter of the air supply nozzle 53. Thus, the air supply nozzle 53 is held movably through the nozzle insertion hole 62a in the arm 62.

Further, the arm 62 has formed therein an opening 62b through which the laser light can be incident upon the lens system.

The air source 55 which supplies air to the air supply nozzle 53 is controlled concerning the supply pressure and the like by a controller 61.

In the second moving member 50 constructed as in the above, the air supply nozzle 53 is supplied with air from the air source 55 controlled as in the above by the controller 61, and air jet is supplied from the end of the air supply nozzle 53 fixed to the air slider 51. The air slider 51 can thus be floated in relation to the object 100. As the air slider 51 is thus floated, the outgoing surface 15b of the SIL 15 can be moved towards and away from the object 100. For example, by controlling the supply pressure in the air source 55 by means of the controller 61, the distance between the outgoing surface 15b of the SIL 15 and the object 100 can be controlled.

Owing to the second moving member 50 provided in the exposure apparatus, the distance between the outgoing surface 15b of the SIL 15 and the object 100 is roughly adjusted by the second moving member 50, and then the gap length can be fine-adjusted by the first moving member 13. That is, in the exposure apparatus, the second moving member 50 is used to control the gap length in the low frequency band, while the first moving member 13 is used to control the gap length in the high frequency band. More particularly, the first and second moving members 13 and 50 in the exposure apparatus are operated as will be described below.

For example, when there exists a sufficient distance between the outgoing surface 15b of the SIL 15 and the object 100, the arm 60 is lowered by controlling the supply pressure in the air source 55 to control the flow of air jet from the air supply nozzle 53.

As the arm 60 is lowered, the main surface 51a of the air slider 51 approaches the object 100, so that the air pressure between the main surface 51a of the air slider 51 and the object 100 is elevated. When the air pressure between the main surface 51a of the air slider 51 and the object 100 is thus elevated, a stable air layer, a so-called air bearing, will be formed. It is possible to prevent the SIL 15 from colliding with the object 100 under the effect of the air bearing.

In the exposure apparatus, the gap length is controlled by the first moving member 13, namely, in the high frequency band in the above condition. By controlling the air flow in the second moving member 50, the gap length can be controlled in the low frequency band.

In the foregoing, the present invention has been described concerning the embodiments in which there are provided the condenser lens 14 and SIL 15 forming together a so-called two-group lens as a convergent lens to project the laser light to the object. However, the present invention is not limited to these embodiments but can adopt a lens system including a lens containing a solid immersion mirror (SIM) or a three- or more-group lens.

What is claimed is:

1. An exposure apparatus comprising:
   a convergent lens disposed opposite to an object and in a near-field of the object to condense an exposure laser light on the object, wherein the convergent lens includes a two-group lens of a condenser lens and a SIL, the SIL and condenser lens being supported together by a support member having a moving member fixed at an end thereof, and wherein the moving member moves the support member and thus moves the two-group lens of the condenser lens and SIL fixed to the support member towards and away from the object;
   an exposure light source to emit the exposure laser light;
   a gap length controlling light source to emit a gap length controlling laser light having a different wavelength from that of the exposure laser light and not in a range to which the object is sensitive, the gap length controlling laser light used only for gap length controlling;
   means for projecting the gap length controlling laser light to the convergent lens;
   means for detecting an intensity of a return part of the gap length controlling laser light reflected off an outgoing surface of the convergent lens opposite to the object, the convergent lens including a substantially hemispherical lens having a substantially flat surface facing the object as the outgoing surface; and
   means for moving the convergent lens for controlling the gap length between a substantially flat surface facing the object as the outgoing surface of the convergent lens and the object based on the light intensity detected by the light intensity detecting means.

2. The apparatus as set forth in claim 1, wherein the wavelength of the gap length controlling laser light is larger than that of the exposure laser light.

3. The apparatus as set forth in claim 1, wherein the wavelength of the gap length controlling laser light is not included in a range to which the object is sensitive.

4. An exposure method in which an exposure laser light is condensed on an object by a convergent lens disposed opposite to the object and in a near-field area of the object, wherein the convergent lens includes a two-group lens of a condenser lens and a SIL, the SIL and condenser lens being supported together by a support member having a moving member fixed at an end thereof, and wherein the moving member moves the support member and thus moves the two-group lens of the condenser lens and SIL fixed to the support member towards and away from the object, the method comprising:
   projecting a gap length controlling laser light having a different of the exposure laser light, and not in a range to which the object is sensitive, to the convergent lens upon which the exposure laser light is incident, the gap length controlling laser light used only for gap length controlling;
   detecting an intensity of a return part of the gap length controlling laser light reflected off an outgoing surface of the convergent lens opposite to the object, the convergent lens including a substantially hemispherical lens having a substantially flat surface facing the object as the outgoing surface; and moving the convergent lens for controlling the gap length between a substantially flat surface facing the object as the outgoing surface of the convergent lens and the object based on the detected intensity of the return light.

5. The method as set forth in claim 4, further comprising a step of:

projecting the gap length controlling laser light whose wavelength is larger than that of the exposure laser light.

6. The method as set forth in claim 4, further comprising a step of:

projecting the gap length controlling laser light whose wavelength is not included in a range to which the object is sensitive.

7. An optical disc drive comprising:

a convergent lens disposed opposite to a signal recording medium object and in a near-field of the signal recording medium to condense a writing and/or reading laser light on the signal recording medium, wherein the convergent lens includes a two-group lens of a condenser lens and a SIL, the SIL and condenser lens being supported together by a support member having a moving member fixed at an end thereof, and wherein the moving member moves the support member and thus moves the two-group lens of the condenser lens and SIL fixed to the support member towards and away from the object;

a light source to emit the writing and/or reading laser light;

a gap length controlling light source to emit a gap length controlling laser light having a different wavelength from that of the writing and/or reading laser light and not in a range to which the object is sensitive, the gap length controlling laser light used only for gap length controlling;

means for projecting the writing and/or reading laser light to the convergent lens;

means for detecting an intensity of a return part of the writing and/or reading laser light reflected off an outgoing surface of the convergent lens opposite to the signal recording medium, the convergent lens including a substantially hemispherical lens having a substantially flat surface facing the object as the outgoing surface; and means for moving the convergent lens for controlling the gap length between a substantially flat surface facing the object as the outgoing surface of the convergent lens and the signal recording medium based on the light intensity detected by the light intensity detecting means.

8. The apparatus as set forth in claim 7, wherein the wavelength of the gap length controlling laser light is larger than that of the writing and/or reading laser light.

9. The apparatus as set forth in claim 7, wherein the wavelength of the gap length controlling laser light is not included in a range to which the signal recording layer of the signal recording medium is sensitive.

10. A recording and/or reproducing method in which a writing and/or reading laser light is condensed on a signal recording medium by a convergent lens disposed opposite to the signal recording medium and in a near-field area of the signal recording medium, wherein the convergent lens includes a two-group lens of a condenser lens and a SIL, the SIL and condenser lens being supported together by a support member having a moving member fixed at an end thereof, and wherein the moving member moves the support member and thus moves the two-group lens of the condenser lens and SIL fixed to the support member towards and away from the object, the method comprising:

projecting a gap length controlling laser light having a differ of the writing and/or reading laser light, and not in a range to which the object is sensitive, to the convergent lens upon which the writing and/or reading laser light is incident, the gap length controlling laser light used only for gap length controlling;

detecting an intensity of a return part of the gap length controlling laser light reflected off an outgoing surface of the convergent lens opposite to the signal recording medium, the convergent lens including a substantially hemispherical lens having a substantially flat surface facing the object as the outgoing surface; and moving the convergent lens for controlling the gap length between a substantially flat surface facing the object as the outgoing surface of the convergent lens and the signal recording medium based on the detected intensity of the return light.

11. The method as set forth in claim 10, further comprising a step of:

projecting the gap length controlling laser light whose wavelength is larger than that of the writing and/or reading laser light.

12. The method as set forth in claim 10, further comprising a step of:

projecting the gap length controlling laser light whose wavelength is not included in a range to which the signal recording layer of the signal recording medium is sensitive.

13. An exposure apparatus comprising:

a convergent lens disposed opposite to an object and in a near-field of the object to condense an exposure laser light on the object, wherein the convergent lens includes a two-group lens of a condenser lens and a SIL, the SIL and condenser lens being supported together by a support member having a moving member fixed at an end thereof, and wherein the moving member moves the support member and thus moves the two-group lens of the condenser lens and SIL fixed to the support member towards and away from the object;

an exposure light source to emit the exposure laser light;

a gap length controlling light source to emit a gap length controlling laser light having a different wavelength from that of the exposure laser light and not in a range to which the object is sensitive, the gap length controlling laser light used only for gap length controlling;

optical units to project the gap length controlling laser light to the convergent lens;

a detector to detect an intensity of a return part of the gap length controlling laser light reflected off an outgoing surface of the convergent lens opposite to the object, the convergent lens including a substantially hemispherical lens having a substantially flat surface facing the object as the outgoing surface; and a controller to move the convergent lens to control the gap length between a substantially flat surface facing the object as the outgoing surface of the convergent lens and the object based on the light intensity detected by the light intensity detecting means.

14. The apparatus as set forth in claim 13, wherein the wavelength of the gap length controlling laser light is larger than that of the exposure laser light.

15. The apparatus as set forth in claim 13, wherein the wavelength of the gap length controlling laser light is not included in a range to which the object is sensitive.

16. An optical disc drive comprising:

a convergent lens disposed opposite to a signal recording medium object and in a near-field of the signal recording medium to condense a writing and/or reading laser light on the signal recording medium, wherein the convergent lens includes a two-group lens of a condenser lens and a SIL, the SIL and condenser lens being supported together by a support member having a moving member fixed at an end thereof, and wherein the moving member moves the support member and thus moves the two-group lens of the condenser lens and SIL fixed to the support member towards and away from the object;

a light source to emit the writing and/or reading laser light;

a gap length controlling light source to emit a gap length controlling laser light having a different wavelength from that of the writing and/or reading laser light and not in a range to which the object is sensitive, the gap length controlling laser light used only for gap length controlling;

optical units to project the writing and/or reading laser light to the convergent lens;

a detector to detect an intensity of a return part of the writing and/or reading laser light reflected off an outgoing surface of the convergent lens opposite to the signal recording medium, the convergent lens including a substantially hemispherical lens having a substantially flat surface facing the object as the outgoing surface; and a controller to move the convergent lens to control the gap length between a substantially flat surface facing the object as the outgoing surface of the convergent lens and the signal recording medium based on the light intensity detected by the light intensity detecting means.

17. The apparatus as set forth in claim 16, wherein the wavelength of the gap length controlling laser light is larger than that of the writing and/or reading laser light.

18. The apparatus as set forth in claim 16, wherein the wavelength of the gap length controlling laser light is not included in a range to which the signal recording layer of the signal recording medium is sensitive.

* * * * *

UNITED STATES PATENT AND TRADEMARK OFFICE
CERTIFICATE OF CORRECTION

PATENT NO. : 6,717,896 B1
DATED : April 6, 2004
INVENTOR(S) : Imanishi et al.

It is certified that error appears in the above-identified patent and that said Letters Patent is hereby corrected as shown below:

Column 2,
Line 3, change "sport" to -- spot --;
Line 25, change "100mm" to -- 100nm --;

Column 4,
Line 12, delete first occurrence of "in which";
Line 36, change "intention" to -- invention --;

Column 6,
Line 66, change "dicliroic" to -- dichroic --;

Column 11,
Line 4, change "man" to -- main --;

Column 12,
Line 59, after "different" add -- wavelength from that --;

Column 14,
Line 8, change "differ" to -- different wavelength from that --;

Signed and Sealed this

Third Day of August, 2004

JON W. DUDAS
*Acting Director of the United States Patent and Trademark Office*